United States Patent
Katayama

(10) Patent No.: US 8,525,219 B2
(45) Date of Patent: Sep. 3, 2013

(54) COMPOSITION FOR SILICONE RESIN

(75) Inventor: Hiroyuki Katayama, Osaka (JP)

(73) Assignee: Nitto Denko Corporation, Osaka (JP)

( * ) Notice: Subject to any disclaimer, the term of this patent is extended or adjusted under 35 U.S.C. 154(b) by 337 days.

(21) Appl. No.: 13/091,743

(22) Filed: Apr. 21, 2011

(65) Prior Publication Data

US 2011/0260209 A1    Oct. 27, 2011

(30) Foreign Application Priority Data

Apr. 23, 2010    (JP) ................. 2010-099933

(51) Int. Cl.
- *H01L 33/52* (2010.01)
- *B32B 9/04* (2006.01)
- *C08G 77/12* (2006.01)

(52) U.S. Cl.
USPC ............. 257/100; 257/E33.059; 428/447; 528/31

(58) Field of Classification Search
USPC ........... 257/100, E33.059; 528/31; 428/447
See application file for complete search history.

(56) References Cited

U.S. PATENT DOCUMENTS

| 4,754,013 | A | 6/1988 | Antonen |
| 6,387,487 | B1 | 5/2002 | Greenberg et al. |
| 2004/0116640 | A1 | 6/2004 | Miyoshi |
| 2008/0003370 | A1 | 1/2008 | Sweet et al. |
| 2013/0020610 | A1 * | 1/2013 | Katayama ............ 257/100 |
| 2013/0069106 | A1 * | 3/2013 | Mitani et al. ........ 257/100 |
| 2013/0092974 | A1 * | 4/2013 | Kimura et al. ....... 257/100 |

FOREIGN PATENT DOCUMENTS

| JP | 6-118254 A | 4/1994 |
| JP | 2000-198930 A | 7/2000 |
| JP | 2004-186168 A | 7/2004 |
| JP | 2008-150437 A | 7/2008 |
| JP | 2009021394 A | 1/2009 |

OTHER PUBLICATIONS

European Search Report issued in corresponding application No. 11163466.3 on Jun. 24, 2011.

* cited by examiner

*Primary Examiner* — Minh-Loan T Tran

(74) *Attorney, Agent, or Firm* — Sughrue Mion, PLLC

(57) ABSTRACT

The present invention relates to a composition for a silicone resin, including: (1) an organopolysiloxane having a silanol group at an end thereof; (2) an organopolysiloxane having at least one alkenylsilyl group and at least two hydrosilyl groups in one molecule thereof; (3) a condensation catalyst; and (4) a hydrosilylation catalyst.

8 Claims, No Drawings

COMPOSITION FOR SILICONE RESIN

FIELD OF THE INVENTION

The present invention relates to a composition for a silicone resin. More particularly, the invention relates to a composition for a silicone resin, the composition being able to form a semi-cured state where encapsulation processing of an optical semiconductor element can be performed, a silicone resin sheet which is a semi-cured material of the composition, a resin-cured material obtained by further curing the sheet, and an optical-semiconductor device encapsulated with the sheet.

BACKGROUND OF THE INVENTION

High-power white LED devices whose application to generic illumination has been studied demand encapsulation materials having excellent light resistance and heat resistance. In recent years, so-called "addition curing type silicone" has been heavily used.

This addition curing type silicone is obtained by thermal curing of a mixture mainly composed of a silicone derivative having vinyl groups on a main chain thereof and a silicone derivative having SiH groups on a main chain thereof in the presence of a platinum catalyst. For example, Patent Document 1 discloses a resin composition which provides a cured material having excellent transparency and insulating characteristics by introducing an organopolysiloxane into a composition to set the molar ratio of silicon-bonded hydrogen atoms in the composition to alkenyl groups to a specific range.

Patent Document 2 discloses a resin composition containing a silicone resin having at least two silicon-bonded alkenyl groups in one molecule thereof and an organohydrogensilane and/or an organohydrogensiloxane having at least two silicon-bonded hydrogen atoms in one molecule thereof.

Patent Document 3 discloses a composition which provides a cured material having an excellent strength by using a straight-chain polyorganohydrogensiloxane having a silicon-bonded hydrogen atom (a Si—H group) midway of a molecular chain in combination with a straight-chain polyorganohydrogensiloxane having Si—H groups at both ends of a molecular chain in specific amounts.

On the other hand, a high active platinum catalyst is generally used in the addition curing type silicone resin. Accordingly, when a curing reaction once starts, it is extremely difficult to stop the reaction halfway. It is therefore difficult to form a semi-cured state (stage B). Then, it has been known that addition of a phosphorus compound, a nitrogen compound, a sulfur compound or an acetylene as a reaction inhibitor is effective, in order to decrease the catalytic activity of the platinum catalyst (for example, see Patent Document 4).

Patent Document 1: JP-A-2000-198930
Patent Document 2: JP-A-2004-186168
Patent Document 3: JP-A-2008-150437
Patent Document 4: JP-A-6-118254

SUMMARY OF THE INVENTION

However, although the conventional addition curing type silicone resins have excellent durability, they are composed of viscous liquid before the curing reaction, so that handling becomes complicated, and the viscosity varies depending on the surrounding environment in some cases. Thus, they remain unsatisfactory.

Further, compounds known as a reaction inhibitor exert an influence on durability of the resins, so that another method of reaction control is required.

An object of the invention is to provide a composition for a silicone resin, the composition being able to form a semi-cured state where encapsulation processing of an optical semiconductor element can be performed and to maintain the state and further being able to provide a silicone resin composition having excellent light resistance and heat resistance, a silicone resin sheet which is a semi-cured material of the composition, a resin-cured material obtained by further curing the sheet, and an optical-semiconductor device encapsulated with the sheet.

Namely, the present invention relates to the following items 1 to 5.

1. A composition for a silicone resin, including:
   (1) an organopolysiloxane having a silanol group at an end thereof;
   (2) an organopolysiloxane having at least one alkenylsilyl group and at least two hydrosilyl groups in one molecule thereof;
   (3) a condensation catalyst; and
   (4) a hydrosilylation catalyst.
2. The composition for a silicone resin according to item 1, in which the (1) organopolysiloxane having a silanol group at an end thereof includes a compound represented by the formula (I):

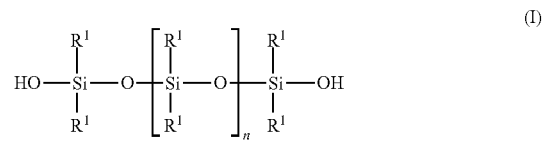

in which $R^1$ is a monovalent hydrocarbon group and n is an integer of 1 or more, provided that all $R^1$ groups may be the same or different.

3. A silicone resin sheet obtained by semi-curing the composition for a silicone resin according to item 1 or 2.
4. A silicone resin cured material obtained by curing the silicone resin sheet according to item 3.
5. An optical-semiconductor device obtained by encapsulating an optical-semiconductor element using the silicone resin sheet according to item 3.

The composition for a silicone resin of the invention exhibits excellent effects of being able to form a semi-cured state where encapsulation processing of an optical semiconductor element can be performed and to maintain the state and further being able to provide a silicone resin composition having excellent light resistance and heat resistance.

DETAILED DESCRIPTION OF THE INVENTION

The composition of the invention includes: (1) an organopolysiloxane having a silanol group at an end thereof [component (1)]; (2) an organopolysiloxane having at least one alkenylsilyl group and at least two hydrosilyl groups in one molecule thereof [component (2)]; (3) a condensation catalyst; and (4) a hydrosilylation catalyst. The composition has a significant characteristic that the component (1) is a component relating to a condensation reaction and the component (2) is a component relating to a condensation reaction and an addition reaction (hydrosilylation reaction).

A semi-cured state (hereinafter also referred to as stage B) of a general epoxy resin or the like is usually achieved by controlling thermosetting conditions. Specifically, for example, a crosslinking reaction of a monomer is allowed to partially proceed by heating at 80° C., thereby preparing pellets of stage B. Then, the resulting pellets are subjected to desired molding processing, and then, heated at 150° C. to be completely cured. Moreover, the addition curing type thermosetting silicone resin is obtained by an addition reaction (hydrosilylation reaction) of a silicone derivative having vinyl groups on a main chain thereof and a silicone derivative having SiH groups on a main chain thereof, and a high active platinum catalyst is generally used. Accordingly, when a curing reaction once starts, it is extremely difficult to stop the reaction halfway. It is therefore difficult to form stage B. It is also known to control the reaction with a reaction inhibitor. However, a progress of the reaction varies depending on the kind and amount of the reaction inhibitor used, so that the control with the reaction inhibitor is not easy.

On the other hand, in the composition of the invention, the component (1) is a component relating to the condensation reaction and the component (2) is a component relating to the condensation reaction and the hydrosilylation reaction. Since the condensation reaction and the hydrosilylation reaction are different in reaction temperature, it is possible to control the crosslinking between the monomers. Specifically, a resin in the semi-cured state (stage B) is first prepared by the condensation reaction of the monomers relating the condensation reaction and then a completely cured resin can be prepared by the addition reaction of the monomer relating to the hydrosilylation reaction. Incidentally, in this specification, the semi-cured material, that is to say, the material in the semi-cured state (stage B), means a material in a state between stage A where the material is soluble in a solvent and stage C where the material is completely cured, and in a state where curing or gelation somewhat proceeds, and the material is swelled but is not completely dissolved in a solvent, and is softened but not melted by heating. The totally cured material (completely cured material) means a material in a state where curing or gelation has completely proceeded.

Moreover, since the composition of the invention contains the component (1) and the component (2), as the condensation reaction, a silanol condensation reaction represented by the formula (A):

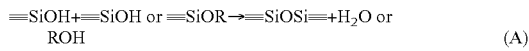

≡SiOH+≡SiOH or ≡SiOR→≡SiOSi≡+H₂O or ROH  (A)

and a hydrosilane condensation reaction represented by the formula (B):

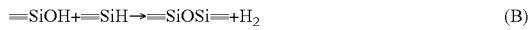

≡SiOH+≡SiH→≡SiOSi≡+H₂  (B)

take place. Of these, the hydrosilane condensation represented by the formula (B) is faster in the reaction rate than the silanol condensation, the semi-cured material can be easily prepared by using the composition of the invention.

Further, since the component (2) in the invention is a siloxane compound having a hydrosilyl group relating to the condensation reaction and an alkenylsilyl group relating to the condensation reaction and the hydrosilyl reaction, the component (2) maintains a good dispersed state owing to the crosslinked structure formed by the condensation reaction even in the semi-cured state where only the condensation reaction takes place as compared with, for example, the case where a composition containing a siloxane compound having only a hydrosilyl group and a siloxane compound having only an alkenylsilyl group is used, so that the component does not bleed out. Accordingly, unless the hydrosilylation reaction is induced, a good semi-cured state can be maintained and the storage stability in stage B is secured.

Furthermore, since the resin monomers in the composition of the invention both contain silicones as main frameworks, the resulting resin composition becomes excellent in heat resistance and light resistance.

(1) Organopolysiloxane Having Silanol Group at End Thereof [component (1)]

As the organopolysiloxane having a silanol group at an end thereof, a compound having at least two silanol groups in one molecule thereof is preferred from the viewpoint of performing the condensation reaction efficiently. Moreover, the position to which the silanol group is bonded is an end from the viewpoint of reaction stability, and both ends are preferred. Accordingly, from such a viewpoint, the organopolysiloxane having a silanol group at an end thereof to be used in the invention preferably includes a compound represented by the formula (I):

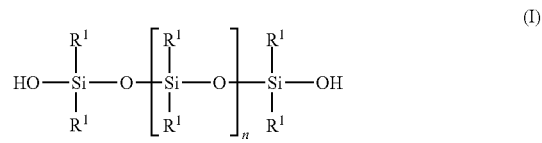

in which $R^1$ is a monovalent hydrocarbon group and n is an integer of 1 or more, provided that all $R^1$ groups may be the same or different.

$R^1$ in the formula (I) represents a monovalent hydrocarbon group, and a saturated or unsaturated, linear, branched or cyclic hydrocarbon group may be mentioned. From the viewpoints of transparency and heat resistance, the carbon number of the hydrocarbon group is preferably from 1 to 20, and more preferably from 1 to 10. Specifically, there are exemplified a methyl group, an ethyl group, a propyl group, a butyl group, a pentyl group, a hexyl group, a phenyl group, a naphthyl group, a cyclohexyl group, a cyclopentyl group and the like. Above all, a methyl group is preferred from the viewpoints of transparency, heat resistance and light resistance of the resulting resin composition. Incidentally, in the formula (I), all $R^1$ groups may be the same or different.

Although n in the formula (I) represents an integer of 1 or more, it is preferably an integer of 1 to 10,000, and more preferably an integer of 1 to 1,000, from the viewpoint of toughness of the cured material.

Examples of such compounds represented by the formula (I) include a dual-end silanol type polydimethylsiloxane, a dual-end silanol type polymethylphenylsiloxane and a dual-end silanol type polydiphenylsiloxane. These can be used either alone or as a combination of two or more thereof.

The compound represented by the formula (I) may be commercially available ones or may be ones synthesized according to known methods.

The molecular weight of the compound represented by the formula (I) is preferably from 1,000 to 1,000,000, and more preferably from 1,000 to 100,000, from the viewpoints of toughness of the cured material. Incidentally, in this specification, the molecular weight of the silicone derivative is measured by gel filtration chromatography (GPC).

The content of the compound represented by the formula (I) in the component (1) is preferably 50% by weight or more, more preferably 80% by weight or more, and further preferably substantially 100% by weight.

The content of the component (1) is preferably from 1 to 99% by weight, and more preferably from 10 to 80% by weight in the composition.

(2) Organopolysiloxane Having at Least One Alkenylsilyl Group and at Least Two Hydrosilyl Groups in One Molecule Thereof [component (2)]

The component (2) is a component relating to both the condensation reaction and the hydrosilylation reaction. More particularly, at least two hydrosilyl groups relating to the above both reactions exist in one molecule thereof and at least one alkenylsilyl group relating to the hydrosilylation reaction exists in one molecule thereof. In this connection, the silicone atoms constituting the individual functional groups of at least two hydrosilyl groups and at least one alkenylsilyl group are preferably different from one another. In the invention, such a compound can be used either alone or as a combination of two or more thereof.

The alkenylsilyl group is a group where an alkenyl group is bonded to a silicon atom. The alkenylsilyl group may be disposed in any position of a molecular end, a main chain, and a side chain.

The alkenyl group represents a substituted or unsubstituted alkenyl group and may be linear, branched or cyclic one as long as it is an organic group containing an alkenyl group in a framework thereof. From the viewpoints of transparency and heat resistance, the carbon number of the organic group is preferably from 1 to 20, and more preferably from 1 to 10. Specifically, there are exemplified a vinyl group, an allyl group, a propenyl group, a butenyl group, a pentenyl group, a hexenyl group, a heptenyl group, an octenyl group, a norbornenyl group, a cyclohexenyl group and the like. Above all, a vinyl group is preferred from the viewpoint of reactivity to the hydrosilylation reaction.

The hydrosilyl group is a group where a hydrogen atom is bonded to a silicon atom. The group may be disposed in any position of a molecular end, a main chain, and a side chain.

There is no particular limitation on the functional groups bonded to the silicon atom other than the alkenyl group and hydrogen atom, and $R^1$ in the compound represented by the above formula (I) and the like are exemplified.

The functional group equivalent of the alkenylsilyl group in the component (2) is preferably from 0.01 to 10 mmol/g, and more preferably from 0.1 to 5 mmol/g, from the viewpoints of toughness and flexibility of the cured material. When the equivalent is 0.01 mmol/g or more, a sufficient strength is exhibited, whereas when it is 10 mmol/g or less, a good flexibility is exhibited. In the present specification, the functional group equivalent of the silicone derivative can be measured by a method described in Examples to be mentioned later.

The functional group equivalent of the hydrosilyl group in the component (2) is preferably from 0.01 to 10 mmol/g, and more preferably from 0.1 to 5 mmol/g, from the viewpoints of toughness and flexibility of the cured material. When the equivalent is 0.01 mmol/g or more, a sufficient strength is exhibited, whereas when it is 10 mmol/g or less, a good flexibility is exhibited.

The molar ratio of the alkenylsilyl group to the hydrosilyl group (alkenylsilyl group/hydrosilyl group) is preferably from 1/50 to 50/1, and more preferably from 1/5 to 5/1.

As such a compound, there may be mentioned a compound where the main chain is composed of dimethylsiloxane units, methyl(vinyl)siloxane units, methyl(hydro)siloxane units, and the like and trimethylsiloxy groups are present at ends. Specifically, there may be exemplified linear poly(methyl)(vinyl)(hydro)siloxanes and cyclic, branched-chain, or three-dimensional reticular poly(methyl)(vinyl)(hydro)siloxanes. These can be used either alone or as a combination of two or more thereof.

The above compounds may be commercially available ones or may be ones synthesized according to known methods.

The viscosity of the component (2) at 25° C. is preferably from 100 to 500,000 mPa·s, and more preferably 300 to 100,000 mPa·s, form the viewpoint of toughness of the cured material. In the specification, the viscosity can be measured by using a B-type viscometer.

The content of the component (2) is preferably from 1 to 99% by weight, and more preferably from 20 to 90% by weight in the composition.

Moreover, the weight ratio of the component (1) to the component (2) is such that the molar ratio of the silanol group of the component (1) to the hydrosilyl group of the component (2) (silanol group/hydrosilyl group) is preferably from 1/100 to 1/1.1, and more preferably from 1/50 to 1/2, from the viewpoint of toughness and curability of the semi-cured material. Namely, when the ratio is 1/100 or more, namely, the number of the hydrosilyl group is 100 or less based on one silanol group, the flexibility of the semi-cured material becomes good and thus operability thereof becomes good. Also, when the ratio is 1/1.1 or less, namely, the number of the hydrosilyl group is 1.1 or more based on one silanol group, an unreacted hydrosilyl group remains even after the condensation reaction and the subsequent hydrosilylation reaction well proceeds.

(3) Condensation Catalyst

There is no particular limitation on the condensation catalyst in the invention, as long as it is a compound catalyzing the condensation reaction of the silanol groups each other and the condensation reaction of the silanol group and the hydrosilyl group. There are exemplified bases such as potassium hydroxide, sodium hydroxide, sodium carbonate and tetramethylammonium hydroxide; and metallic catalysts such as palladium, platinum and boron. Above all, tetramethylammonium hydroxide is preferred, which also acts as a stabilizer of the hydrosilylation catalyst.

Tetramethylammonium hydroxide may be used in a solid state as it is but is preferably used as an aqueous solution or a methanol solution thereof from the viewpoint of handling ability. From the viewpoint of transparency of the resin, use of a methanol solution thereof is more preferred.

The content of the condensation catalyst in the composition is preferably from 0.1 to 100 moles, and more preferably from 1 to 50 moles, based on 100 moles of the component (1). When the content is 0.1 mole or more, the condensation reaction sufficiently proceeds, whereas, when the content is 100 moles or less, the transparency of the cured material is good.

(4) Hydrosilylation Catalyst

There is no particular limitation on the hydrosilylation catalyst in the invention, as long as it is a compound catalyzing the hydrosilylation reaction between the hydrosilyl group and the alkenylsilyl group. There are exemplified platinum catalysts such as platinum black, platinum chloride, chloroplatinic acid, a platinum-olefin complex, a platinum-carbonyl complex and platinum-acetyl acetate; palladium catalysts; rhodium catalysts and the like. Above all, a platinum-carbonyl complex such as a platinum(carbonyl)cyclovinylmethylsiloxane is preferred from the viewpoints of compatibility, transparency and catalytic activity.

With regard to the content of the hydrosilylation catalyst, for example, in the case of using a platinum catalyst, the platinum content is preferably from $1.0 \times 10^{-4}$ to 0.5 part by weight, and more preferably from $1.0 \times 10^{-3}$ to 0.05 part by weight based on 100 parts by weight of the component (1), from the viewpoint of the curing rate.

The composition for a silicone resin of the invention can contain other arbitrary components, in addition to the above, within the range not impairing the effects of the invention. For example, there are exemplified inorganic fillers such as silica, titanium oxide, zirconium oxide, magnesium oxide, zinc oxide, iron oxide, aluminum hydroxide, calcium carbonate, layered mica, carbon black, diatomaceous earth, glass fiber, and oxide, nitride, and oxynitride fluorescent materials activated with a lanthanoid element, as well as those obtained by surface-treatment of these fillers with an organosilicon compound such as an organoalkoxysilane, an organochlorosilane or an organosilazane. In addition, the composition may contain additives such as an antioxidant, a modifying agent, a surfactant, a dye, a pigment, a discoloration preventing agent, an ultraviolet absorber, a creep hardening preventing agent, a plasticizer, a thixotropy-imparting agent, and a fungicide.

The composition for a silicone resin of the invention can be prepared without particular limitation, so long as the composition contains each components of (1) the organopolysiloxane having a silanol group at an end thereof; (2) the organopolysiloxane having at least one alkenylsilyl group and at least two hydrosilyl groups in one molecule thereof; (3) the condensation catalyst; and (4) the hydrosilylation catalyst. For example, the composition for a silicone resin can be prepared by mixing these components and stirring the mixture preferably at 0 to 60° C. for 1 to 120 minutes.

Incidentally, the condensation reaction may be partially initiated. The progress degree of the condensation reaction can be confirmed by the degree of disappearance of a peak derived from the hydrosilyl group according to $^1$H-NMR measurement. Also, hydrogen gas may be generated by initiation of the condensation reaction.

The viscosity of the thus obtained composition of the invention at 25° C. is preferably from 100 to 1,000,000 mPa·s, and more preferably from 500 to 100,000 mPa·s, from the viewpoints of handling ability and coating accuracy.

The composition for a silicone resin of the invention is applied, for example, onto a release sheet (for example, an organic polymer film such as a polyester substrate, a ceramic, a metal, or the like) whose surface is release treated to an appropriate thickness by a method such as casting, spin coating or roll coating, and dried by heating, thereby being able to form the composition into the sheet shape. In the composition of the invention, the condensation reaction can be completed by this heating to prepare a silicone resin sheet in the semi-cured state (stage B). Therefore, the invention also provides a silicone resin sheet obtained by semi-curing the composition for a silicone resin of the invention. Incidentally, in this specification, "completion of the reaction" means the case where 80% or more of the hydrosilyl groups relating to the condensation reaction have reacted, and it can be confirmed by measuring the hydrosilyl group content by the above-mentioned $^1$H-NMR.

The heating temperature is preferably from 20 to 200° C., and more preferably from 40 to 150° C. The heating time is preferably from 0.1 to 120 minutes, and more preferably from 1 to 60 minutes.

The thickness of the silicone resin sheet is not particularly limited but is preferably from 100 to 10,000 µm, and more preferably 100 to 3,000 µm.

Since the silicone resin sheet of the invention is in the semi-cured state, for example, the resin sheet is placed as such on an optical semiconductor element or on a known resin after potting, followed by performing encapsulation processing, and thereafter, the resin sheet is completely cured by heating at high temperature, thereby being able to prepare an optical semiconductor device. Accordingly, the invention provides an optical-semiconductor device obtained by encapsulating an optical-semiconductor element using the silicone resin sheet of the invention.

The complete curing of the silicone resin sheet of the invention is performed by the reaction of the component relating to the hydrosilylation reaction. Accordingly, as another embodiment of the invention, there is provided a silicone resin cured material obtained by curing the silicone resin sheet of the invention. The progress degree of the hydrosilylation reaction can be confirmed by the degree of absorption of a peak derived from the hydrosilyl group, according to IR measurement. For example, when the absorption intensity is less than 20% of an initial value (before the curing reaction), it can be judged that the hydrosilylation reaction is completed and the resin sheet is completely cured.

There is no particular limitation on a method for placing the sheet on the substrate, followed by performing encapsulation processing. For example, there is exemplified a method of pressing the sheet on the substrate by heating preferably at 100 to 200° C. and 0.01 to 10 MPa, more preferably at 120 to 180° C. and 0.1 to 1 MPa, for 2 to 600 seconds, using a laminator, and then, performing encapsulation processing.

The heating temperature of the encapsulation processing is preferably from 120 to 250° C., and more preferably from 150 to 200° C. The heating time is preferably from 0.5 to 48 hours, and more preferably from 1 to 24 hours.

EXAMPLES

The invention will be described below with reference to examples, a comparative example and a reference example, but is not construed as being limited thereto.

[Average Molecular Weight of Silicone Derivative]

The molecular weight of each of the silicone derivatives is determined in terms of polystyrene by gel filtration chromatography (GPC).

[Functional Group Equivalent of Silicone Derivative]

The functional group equivalent is measured by $^1$H-NMR using an internal standard substance.

[Viscosity of Silicone Derivative and Composition]

The viscosity is measured by using a rheometer (B type rheometer) under conditions of 25° C. and 1 atm.

Example 1

A composition for a silicone resin was obtained by mixing 10 g (0.87 mmol) of a silanol-ended polydimethylsiloxane [a compound where all $R^1$ groups in the formula (I) are methyl groups and n represents 153, average molecular weight: 11,500], 10 g of a poly(methyl)(vinyl)(hydro)siloxane [vinylsilyl equivalent: 0.18 mmol/g, hydrosilyl equivalent: 0.51 mmol/g, viscosity (25° C.): 12,000 mPa·s], 0.14 mL (catalyst amount: 0.13 mmol, 15 moles based on 100 moles of the silanol-ended polydimethylsiloxane) of a methanol solution of tetramethylammonium hydroxide (concentration: 10% by weight), and 0.018 mL (platinum content: 0.0036 part by weight based on 100 parts by weight of the silanol-ended polydimethylsiloxane) of an oligosiloxane solution of a platinum(carbonyl)cyclovinylmethylsiloxane complex (platinum concentration: 2% by weight) under stirring at room temperature (20° C.) for 10 minutes.

Example 2

A composition for a silicone resin was obtained in the same manner as in Example 1 except that the amount of the poly(methyl)(vinyl)(hydro)siloxane was changed from 10 g to 50 g in Example 1.

Example 3

A composition for a silicone resin was obtained in the same manner as in Example 1 except that 10 g of a poly(methyl)(vinyl)(hydro)siloxane [vinylsilyl equivalent: 0.38 mmol/g, hydrosilyl equivalent: 1.27 mmol/g, viscosity (25° C.): 4,000 mPa·s] was used instead of the use of 10 g of a poly(methyl)(vinyl)(hydro)siloxane [vinylsilyl equivalent: 0.18 mmol/g, hydrosilyl equivalent: 0.51 mmol/g, viscosity (25° C.): 12,000 mPa·s] in Example 1.

Example 4

A composition for a silicone resin was obtained in the same manner as in Example 1 except that 2.5 g (0.83 mmol) of a silanol-ended polydimethylsiloxane [a compound where all $R^1$ groups in the formula (I) are methyl groups and n represents 38, average molecular weight: 3,000] was used instead of the use of 10 g (0.87 mmol) of a silanol-ended polydimethylsiloxane [a compound where all $R^1$ groups in the formula (I) are methyl groups and n represents 153, average molecular weight: 11,500] in Example 1.

Comparative Example 1

A composition for a silicone resin was obtained in the same manner as in Example 1 except that the methanol solution of tetramethylammonium hydroxide was not used in Example 1.

Using the obtained compositions, semi-cured materials, completely cured materials and optical semiconductor devices were prepared according to the following methods. Incidentally, 10 g of A solution and 10 g of B solution of a commercially available two-component mixing type silicone elastomer (manufactured by Wacker AsahiKasei Silicone Co., Ltd., a thermosetting high viscosity product) were thoroughly mixed to prepare a composition for a silicone resin (viscosity at 25° C.: 12,000 mPa·s), and a semi-cured material, a completely cured material and an optical semiconductor device were prepared as Reference Example 1.

Preparation Example 1 of Semi-Cured Material

Each composition was applied on a biaxially oriented polyester film (manufactured by Mitsubishi Chemical Polyester Film Co., Ltd., 50 μm) to a thickness of 500 μm. Then, the composition was heated under conditions shown in Table 1, thereby obtaining a sheet-shaped semi-cured material (sheet) (thickness: 500 μm).

Preparation Example 1 of Completely Cured Material

The sheets obtained in the above were heated at 150° C. for 5 hours for the sheets of Examples 1 to 4 and Comparative Example 1 or at 150° C. for 1 hour for the sheet of Reference Example 1, thereby preparing completely cured silicone resin sheets.

Preparation Example 1 of Optical Semiconductor Device

A substrate on which a blue LED was mounted was coated with each of the sheets of Examples 1 to 4 and Comparative Example 1 in a semi-cured state or the sheet of Reference Example 1 in a semi-cured state which had been stored at 5° C. for 24 hours, followed by heating under reduced pressure at 160° C. for 5 minutes and pressing at a pressure of 0.2 MPa.

Then, the resulting device was heated at 150° C. for 1 hour, thereby completely curing the resin to prepare an optical semiconductor device.

For the semi-cured materials, completely cured materials and optical semiconductor devices obtained above, characteristics were evaluated according to the following Test Examples 1 to 6. The results thereof are shown in Table 1.

Test Example 1

Hardness

When a load of 7 g/mm² was applied to the semi-cured material and the completely cured material immediately after the preparation by a sensor head using a digital length measuring meter (MS-5C, manufactured by Nikon Corporation), the distance the sensor head sank from a surface of the sheet was measured, and the sheet hardness was determined based on the following equation. Incidentally, the larger value of the sheet hardness shows that the sheet is harder.

Sheet hardness=[1−(the distance (μm) the sensor head sank/the film thickness (μm) of the sample)]×100

Test Example 2

Storage Stability

For each of the semi-cured material immediately after the preparation and after the storage at 5° C. for 24 hours, the sheet hardness was determined in the same manner as in Test Example 1. Then, the ratio of the resulting sheet hardness [(after the storage/immediately after the preparation)×100] was calculated as hardness retention (%), and storage stability was evaluated according to the following evaluation criteria. The smaller value of the hardness retention shows the more excellent storage stability in a semi-cured state. In Table 1, the hardness retention was also shown in parenthesis in addition to the results of the above evaluation.

[Evaluation Criteria of Storage Stability]
A: the hardness retention was from 100% to 150%.
B: the hardness retention was more than 150%.

Test Example 3

Light Transmitting Property

The light transmittance (%) of each completely cured material at a wavelength of 450 nm was measured by using a spectrophotometer (U-4100, manufactured by Hitachi High-Technologies Corporation). The higher light transmittance shows the more excellent light transmitting property.

Test Example 4

Heat Resistance

Each completely cured material was allowed to stand still in a hot air type dryer of 150° C., and appearance of the completely cured material after an elapse of 100 hours was visually observed. The case where no change in color from a state before storage was observed was evaluated as "A", and the case where a change in color was observed was evaluated as "B". No change in appearance after storage shows that the material is excellent in heat resistance.

Test Example 5

Encapsulation Property

States of each semiconductor device before and after encapsulation were observed under an optical microscope.

The case where the semiconductor element was completely embedded, no deformation and damage were observed, and the element was lighted was evaluated as "A", and the case where the element was not lighted was evaluated as "B".

Test Example 6

Light Resistance

An electric current of 300 mA was applied to each semiconductor device to light an LED element, and the luminance thereof immediately after the test was started was measured with an instantaneous multiple photometric system (MCPD-3000, manufactured by Otsuka Electronics Co., Ltd.). Then, the LED element was allowed to stand in a state where it was lighted, and the luminance after an elapse of 300 hours was similarly measured. The luminance retention was calculated by the following equation, and the light resistance was evaluated. The higher luminance retention shows the more excellent light resistance.

Luminance retention (%)=(luminance after elapse of 300 hours/luminance immediately after the test was started)×100

TABLE 1

| | | | Example 1 | Example 2 | Example 3 | Example 4 | Comparative Example 1 | Reference Example 1 |
|---|---|---|---|---|---|---|---|---|
| Composition | (1) Silanol-Ended Polydimethylsiloxane | $R^1$ in Formula (I) | Methyl group | Methyl group | Methyl group | Methyl group | Methyl group | — |
| | | n in Formula (I) | 153 | 153 | 153 | 38 | 153 | — |
| | | Average Molecular Weight | 11500 | 11500 | 11500 | 3000 | 11500 | — |
| | | Content (parts by weight)[1] | 100 | 100 | 100 | 100 | 100 | — |
| | (2) Poly(methyl)(vinyl)-(hydro)siloxane | Vinylsilyl Equivalent (mmol/g) | 0.18 | 0.18 | 0.38 | 0.18 | 0.18 | — |
| | | Hydrosilyl Equivalent (mmol/g) | 0.51 | 0.51 | 1.27 | 0.51 | 0.51 | — |
| | | Vinylsilyl Group/Hydrosilyl Group[2] | 0.35 | 0.35 | 0.30 | 0.35 | 0.35 | — |
| | | Viscosity (25° C., mPa·s) | 12000 | 12000 | 4000 | 12000 | 12000 | — |
| | | Content (parts by weight)[1] | 100 | 500 | 100 | 400 | 100 | — |
| | (3) Tetramethylammonium Hydroxide | Content (mol)[3] | 15 | 15 | 15 | 15 | — | — |
| | (4) Platinum(carbonyl)cyclo-vinylmethylsiloxane Complex | Content (parts by weight)[1] | 0.0036 | 0.0036 | 0.0036 | 0.0036 | 0.0036 | — |
| | Silanol Group/Hydrosilyl Group[4] | | 0.34 | 0.068 | 0.14 | 0.33 | 0.34 | — |
| Before Curing | Viscosity (25° C., mPa·s) | | 3100 | 1200 | 2700 | 7900 | 3100 | 12000 |
| Semi-Cured material | Curing Conditions | | 100° C., 4 minutes | 100° C., 10 minutes | 100° C., 25 minutes | 100° C., 7 minutes | 100° C., 10 minutes | 25° C., 16 hours |
| | Hardness Immediately after Preparation | | 3.7 | 1.9 | 3.9 | 1.0 | 0.5 | 7.1 |
| | Hardness after Storage | | 5.3 | 2.4 | 5.0 | 1.3 | 8.5 | 19 |
| | Storage Stability | | A(143) | A(126) | A(128) | A(130) | B(1700) | B(268) |
| Completely Cured Material | Hardness Immediately after Preparation | | 66.1 | 45.2 | 77.5 | 51.7 | 42.5 | 87.0 |
| | Light Transmitting Property (Light Transmittance, %) | | 99 | 99 | 98 | 99 | 99 | 99 |
| | Heat Resistance | | A | A | A | A | A | A |
| Optical-Semi-conductor Device | Encapsulation Property | | A | A | A | A | A | B |
| | Light Resistance (Luminance Retention, %) | | 99.8 | 99.5 | 99.8 | 99.6 | 99.6 | — |

[1] The content shows the content (parts by weight) based on 100 parts by weight of the silanol-ended polydimethylsiloxane.
[2] The ratio shows the molar ratio (vinylsilyl group/hydrosilyl group) of the vinylsilyl group to the hydrosilyl group.
[3] The content shows the content (mol) based on 100 moles of the silanol-ended polydimethylsiloxane.
[4] The ratio shows the molar ratio (silanol group/hydrosilyl group) of the silanol group of (1) silanol-ended polydimethylsiloxane to the hydrosilyl group of (2) poly(methyl)(vinyl)(hydro)siloxane.

As a result, the compositions of Examples can form a semi-cured state and storage stability thereof is excellent as compared with the composition of Comparative Example. In addition, light transparency, heat resistance and light resistance are good, so that it can be said that the compositions have a sufficient performance as an LED encapsulating material. On the other hand, in the composition of Comparative Example 1 where tetramethylammonium hydroxide was not contained, stability of the semi-cured material was poor since the stabilization action of the platinum catalyst did not work and, since the condensation reaction did not proceed, the semi-cured material formed a mixture of a gel material and a liquid material, so that bleeding took place. Moreover, in the silicone elastomer of Reference Example 1, storage stability of the semi-cured material was poor and, when an LED was encapsulated by using the sheet after storage at 5° C. for 24 hours, bonding wires were remarkably distorted to bring about a short, so that the LED was not lighted.

While the invention has been described in detail with reference to specific embodiments thereof, it will be apparent to one skilled in the art that various changes and modifications can be made therein without departing from the spirit and scope thereof.

Incidentally, the present application is based on Japanese Patent Application No. 2010-099933 filed on Apr. 23, 2010, and the contents are incorporated herein by reference.

All references cited herein are incorporated by reference herein in their entirety.

Also, all the references cited herein are incorporated as a whole.

The composition for a silicone resin of the invention is suitably used, for example, at the time of producing semiconductor elements for backlights of liquid crystal screens, traffic signals, outdoor large-sized displays, advertising signs and the like.

What is claimed is:

1. A composition for a silicone resin, comprising:
   (1) an organopolysiloxane having a silanol group at an end thereof;
   (2) an organopolysiloxane having at least one alkenylsilyl group and at least two hydrosilyl groups in one molecule thereof;
   (3) a condensation catalyst; and
   (4) a hydrosilylation catalyst.

2. The composition for a silicone resin according to claim 1, wherein the (1) organopolysiloxane having a silanol group at an end thereof includes a compound represented by the formula (I):

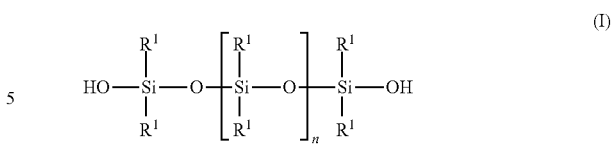

wherein $R^1$ is a monovalent hydrocarbon group and n is an integer of 1 or more, provided that all $R^1$ groups may be the same or different.

3. A silicone resin sheet obtained by semi-curing the composition for a silicone resin according to claim 2.

4. A silicone resin cured material obtained by curing the silicone resin sheet according to claim 3.

5. An optical-semiconductor device obtained by encapsulating an optical-semiconductor element using the silicone resin sheet according to claim 3.

6. A silicone resin sheet obtained by semi-curing the composition for a silicone resin according to claim 1.

7. A silicone resin cured material obtained by curing the silicone resin sheet according to claim 6.

8. An optical-semiconductor device obtained by encapsulating an optical-semiconductor element using the silicone resin sheet according to claim 6.

* * * * *